United States Patent
Simin et al.

(10) Patent No.: US 9,263,533 B2
(45) Date of Patent: Feb. 16, 2016

(54) HIGH-VOLTAGE NORMALLY-OFF FIELD EFFECT TRANSISTOR INCLUDING A CHANNEL WITH A PLURALITY OF ADJACENT SECTIONS

(71) Applicant: Sensor Electronic Technology, Inc., Columbia, SC (US)

(72) Inventors: Grigory Simin, Columbia, SC (US); Michael Shur, Latham, NY (US); Remigijus Gaska, Columbia, SC (US)

(73) Assignee: Sensor Electronic Technology, Inc., Columbia, SC (US)

( * ) Notice: Subject to any disclaimer, the term of this patent is extended or adjusted under 35 U.S.C. 154(b) by 17 days.

(21) Appl. No.: 13/622,379

(22) Filed: Sep. 19, 2012

(65) Prior Publication Data
US 2013/0069114 A1    Mar. 21, 2013

Related U.S. Application Data

(60) Provisional application No. 61/536,335, filed on Sep. 19, 2011.

(51) Int. Cl.
| | |
|---|---|
| H01L 29/66 | (2006.01) |
| H01L 29/76 | (2006.01) |
| H01L 29/788 | (2006.01) |
| H01L 21/70 | (2006.01) |
| H01L 29/02 | (2006.01) |
| H01L 29/417 | (2006.01) |

(Continued)

(52) U.S. Cl.
CPC ...... *H01L 29/4175* (2013.01); *H01L 29/42316* (2013.01); *H01L 29/7787* (2013.01); *H01L 29/2003* (2013.01)

(58) Field of Classification Search
USPC ......... 257/285, 314, 316, 391, 402, 404, 287, 257/194, E21.403, E21.407
See application file for complete search history.

(56) References Cited

U.S. PATENT DOCUMENTS

| | | |
|---|---|---|
| 4,638,341 A | 1/1987 | Baier et al. |
| 5,126,284 A | 6/1992 | Curran |

(Continued)

FOREIGN PATENT DOCUMENTS

JP    2007048866    2/2007

OTHER PUBLICATIONS

Kim, International application No. PCT/US2012/025146, International Search Report and the Written Opinion of the International Searching Authority, SETI-0070-PCT, Aug. 1, 2012, 9 pages.

(Continued)

*Primary Examiner* — Mohammad Islam
*Assistant Examiner* — Jay C Chang
(74) *Attorney, Agent, or Firm* — LaBatt, LLC

(57) ABSTRACT

A device having a channel with multiple voltage thresholds is provided. The channel can include a first section located adjacent to a source electrode, which is a normally-off channel and a second section located between the first section and a drain electrode, which is a normally-on channel. The device can include a charge-controlling electrode connected to the source electrode, which extends from the source electrode over at least a portion of the second section of the channel. During operation of the device, a potential difference between the charge-controlling electrode and the channel can control the on/off state of the normally-on section of the channel.

20 Claims, 11 Drawing Sheets

(51) Int. Cl.
*H01L 29/423* (2006.01)
*H01L 29/778* (2006.01)
*H01L 29/20* (2006.01)

(56) References Cited

U.S. PATENT DOCUMENTS

| | | | |
|---|---|---|---|
| 5,196,907 | A | 3/1993 | Birkle et al. |
| 5,241,193 | A | 8/1993 | Pfiester et al. |
| 6,207,584 | B1 | 3/2001 | Shen et al. |
| 6,285,042 | B1 | 9/2001 | Ohtani et al. |
| 6,589,822 | B1 | 7/2003 | Yamazaki et al. |
| 6,690,042 | B2 | 2/2004 | Khan et al. |
| 6,878,593 | B2 | 4/2005 | Khan et al. |
| 6,903,385 | B2 | 6/2005 | Gaska et al. |
| 7,282,911 | B2 | 10/2007 | Xiang et al. |
| 7,655,962 | B2 | 2/2010 | Simin et al. |
| 7,674,666 | B2 | 3/2010 | Simin et al. |
| 2001/0009785 | A1 | 7/2001 | Arafa et al. |
| 2001/0023964 | A1* | 9/2001 | Wu et al. ............... 257/368 |
| 2004/0036086 | A1 | 2/2004 | Khan et al. |
| 2004/0061129 | A1 | 4/2004 | Saxler et al. |
| 2005/0001234 | A1 | 1/2005 | Inoue et al. |
| 2005/0173728 | A1 | 8/2005 | Saxler |
| 2005/0274977 | A1 | 12/2005 | Saito et al. |
| 2007/0102727 | A1* | 5/2007 | Twynam ............... 257/194 |
| 2007/0249119 | A1* | 10/2007 | Saito ............... 438/253 |
| 2007/0278518 | A1 | 12/2007 | Chen et al. |
| 2007/0295993 | A1 | 12/2007 | Chen et al. |
| 2008/0203446 | A1 | 8/2008 | Simin et al. |
| 2008/0272397 | A1 | 11/2008 | Koudymov et al. |
| 2009/0008804 | A1 | 1/2009 | Standing et al. |
| 2009/0057720 | A1* | 3/2009 | Kaneko ............... 257/194 |
| 2009/0267078 | A1* | 10/2009 | Mishra et al. ............... 257/76 |
| 2010/0156442 | A1 | 6/2010 | Simin et al. |
| 2010/0156475 | A1 | 6/2010 | Simin et al. |
| 2011/0103148 | A1* | 5/2011 | Bhalla et al. ............... 365/185.18 |
| 2012/0205667 | A1 | 8/2012 | Simin et al. |

OTHER PUBLICATIONS

Hess and Brennan (1984), Handbook of Semiconductor Parameters, "7.3.2. Transport Properties in High Electric Field", vol. 1, p. 156.
Simin et al., "High-Power III-Nitride Integrated Microwave Switch with Capacitively-Coupled Contacts", IEEE 2007, pp. 457-460.
Mayo Clinic, "HRL InP NMIC GHz", http://www.mayo.edu/sppdg/packaging_development.html, 2 pages.
Turin et al., "Simulations of Field-Plated and Recessed Gate Gallium Nitride-Based Heterojunction Field-Effect Transistors", International Journal of High Speed Electronics and Systems, vol. 17, No. 1, pp. 19-23, 2007.
Pala et al., "Drain-to-Gate Field Engineering for Improved Frequency Response of GaN-based HEMTs", IEEE, 2007, 2 pages.
G. Simin, "Wide Bandgap Devices with Non-Ohmic Contacts", ECS 2006—210th Meeting of the Electrochemical Society, Cancun, Mexico, Oct. 29-Nov. 3, 2006, 7 pages.
Foutz et al., "Transient Electron Transport in Wurtzite GaN, InN, and AlN", Journal of Applied Physics, vol. 85, No. 11, pp. 7727-7734, Jun. 1, 1999.
Stillman et al., "Closing the Gap: Plasma Wave Electronic Terahertz Detectors", Journal of Nanoelectronics and Optoelectronics, vol. 2, No. 3, pp. 209-221, Dec. 2007.
Jon Kwon Kim, "PCT International Search Report and Written Opinion", PCT Application No. PCT/US2008/054368, Date of Completion: Jul. 30, 2008, 10 pages.
Sungjae Lee et al., "Record RF performance of 45-nm SOI CMOS Technology", IEDM Technical Digest, pp. 255-258, Copyright 2007.
R. Lai et al., "Sub 50 nm InP HEMT Device with Fmax Greater than 1 THz", IEDM Technical Digest, pp. 609-611, IEEE, Copyright 2007.
Zukauskas et al., "Solid State Lighting", Copyright Wiley 2002, http://nina.ecse.rpi.edu/shur/, 132 pages.
Koudymov et al., "RF Transmission Line Method for Wide-Bandgap Heterostructures", IEEE Electron Device Letters, vol. 30, No. 5, pp. 433-435, May 2009.
Simin et al., "III-Nitride Transistors with Capacitively Coupled Contacts", Applied Physics Letters 89, 033510, pp. 1-3, 2006.
Simin et al., "RF-Enhanced Contacts to Wide-Bandgap Devices", IEEE Electron Device Letters, vol. 28, No. 1, pp. 2-4, Jan. 2007.
Mishra, et al., AlGaN/GaN HEMTs—An Overview of Device Operation and Applications, Proc. IEEE, V. 90, 1022-1031 (2002).
Adivarahan, et al., Double-Recessed High-Frequency AlInGaN/InGaN/GaN Metal-Oxide Double Heterostructure Field-Effect Transistors, IEEE Trans. on El. Dev., V. 55, 495-499 (2008).
Iwakami, et al., Evaluation of AlGaN/GaN Heterostructure Field-Effect Transistors on Si Substrate in Power Factor Correction Circuit, Japanese Journal of Applied Physics, V. 46, No. 29, pp. L721-L723 (2007).

* cited by examiner

HIGH-VOLTAGE NORMALLY-OFF FIELD EFFECT TRANSISTOR INCLUDING A CHANNEL WITH A PLURALITY OF ADJACENT SECTIONS

REFERENCE TO RELATED APPLICATIONS

The current application claims the benefit of U.S. Provisional Application No. 61/536,335, titled "High-Voltage Normally-Off Field Effect Transistor," which was filed on 19 Sep. 2011, and which is hereby incorporated by reference.

TECHNICAL FIELD

The disclosure relates generally to semiconductor devices, and more particularly, to a channel having a non-uniform voltage threshold.

BACKGROUND ART

Current high-power field effect transistors, such as gallium nitride (GaN)-based heterostructure field effect transistors (HFETs), feature record high powers and breakdown voltages. Although these features make HFETs extremely promising for various applications in power electronics, certain material and device characteristics significantly limit the performance characteristics of the HFETs.

For example, FIG. 1 shows an illustrative schematic structure of a GaN-based HFET according to the prior art. The GaN-based HFET is essentially a normally-on device. In particular, the device channel (two-dimensional electron gas (2DEG)) is conducting between the source and drain of the HFET in the absence of a voltage bias applied to the gate. Such a characteristic is an important limitation for many power electronics applications since a gate voltage source failure can result in extremely high currents flowing through the power transistors and other connected circuit elements and result in partial or total damage to some of the components of the circuit.

One approach to achieve a normally-off condition in a GaN-based HFET removes a portion of the area under the gate, e.g., via etching or the like. For example, FIG. 2 shows an illustrative schematic structure of a recessed gate GaN-based HFET according to the prior art. A circuit-based approach uses a combination of GaN-based HFETs with normally-off silicon (Si)-based devices forming cascode connections, or Baliga pairs. For example, FIG. 3 shows an illustrative comparison of an AlGaN/GaN-based HFET with a cascode circuit according to the prior art.

However, both of these approaches lead to significant performance degradation. In particular, the recessed gate HFET shown in FIG. 2 has higher leakage current, a lower breakdown voltage, and a lower reliability as compared to the HFET shown in FIG. 1. Furthermore, the circuit of FIG. 3 includes significant parasitic parameters and adds additional series resistance of the Si-based devices to the overall circuit.

SUMMARY OF THE INVENTION

Aspects of the invention provide a device having a channel with multiple voltage thresholds. The channel can include a first section located adjacent to a source electrode, which is a normally-off channel and a second section located between the first section and a drain electrode, which is a normally-on channel. The device can include a charge-controlling electrode connected to the source electrode, which extends from the source electrode over at least a portion of the second section of the channel. During operation of the device, a potential difference between the charge-controlling electrode and the channel can control the on/off state of the normally-on section of the channel.

A first aspect of the invention provides a field effect transistor comprising: a source electrode and a drain electrode; a channel extending from the source electrode to the drain electrode, wherein the channel includes a plurality of adjacent sections, the plurality of adjacent sections including: a first section located adjacent to the source electrode, wherein the first section is a normally-off channel; and a second section located between the first section and the drain electrode, wherein the second section is a normally-on channel; a gate to the first section of the channel; and a charge-controlling electrode connected to the source electrode, wherein the charge-controlling electrode extends from the source electrode over the gate and over at least a portion of the second section.

A second aspect of the invention provides a device comprising: a semiconductor including a channel extending from a source electrode to a drain electrode, wherein the channel includes a plurality of adjacent sections, the plurality of adjacent sections including: a first section located adjacent to the source electrode, wherein the first section is a normally-off channel; and a second section located between the first section and the drain electrode, wherein the second section is a normally-on channel; and a charge-controlling electrode connected to the source electrode, wherein the charge-controlling electrode extends from the source electrode over at least a portion of the second section.

A third aspect of the invention provides a method of fabricating a device, the method comprising: forming a semiconductor including a channel, wherein the channel includes a plurality of adjacent sections, the plurality of adjacent sections including: a first section located adjacent to a first end of the channel, wherein the first section is a normally-off channel; and a second section located between the first section and a second end of the channel opposite the first end, wherein the second section is a normally-on channel; forming a source electrode to the first end of the channel; forming a drain electrode to the second end of the channel; and forming a charge-controlling electrode connected to the source electrode, wherein the charge-controlling electrode extends from the source electrode over at least a portion of the second section.

The illustrative aspects of the invention are designed to solve one or more of the problems herein described and/or one or more other problems not discussed.

BRIEF DESCRIPTION OF THE DRAWINGS

These and other features of the disclosure will be more readily understood from the following detailed description of the various aspects of the invention taken in conjunction with the accompanying drawings that depict various aspects of the invention.

It is noted that the drawings may not be to scale. The drawings are intended to depict only typical aspects of the invention, and therefore should not be considered as limiting the scope of the invention. In the drawings, like numbering represents like elements between the drawings.

DETAILED DESCRIPTION OF THE INVENTION

As indicated above, aspects of the invention provide a device having a channel with multiple voltage thresholds. The channel can include a first section located adjacent to a source electrode, which is a normally-off channel and a second section located between the first section and a drain electrode, which is a normally-on channel. The device can include a charge-controlling electrode connected to the source electrode, which extends from the source electrode over at least a portion of the second section of the channel. During operation of the device, a potential difference between the charge-controlling electrode and the channel can control the on/off state of the normally-on section of the channel.

As used herein, it is understood that the phrase "normally-on channel" means a channel that is in a conducting state when no external voltage or electric field is applied to the channel. Similarly, it is understood that the phrase "normally-off channel" means a channel that is in the non-conducting state when no external voltage or electric field is applied to the channel. It also is understood that: an "insulating material" is a material having a resistivity above $10^{10}$ Ohm×cm; a "semi-insulating material" is a material having a resistivity in the range of $10^5$-$10^{10}$ Ohm×cm; a "semiconductor material" is a material having a resistivity in the range of $10^{-3}$-$10^5$ Ohm×cm; and metals and semi-metals are materials having a resistivity below $10^{-3}$ Ohm×cm. Unless otherwise noted, the term "set" means one or more (i.e., at least one) and the phrase "any solution" means any now known or later developed solution.

Figure 1:
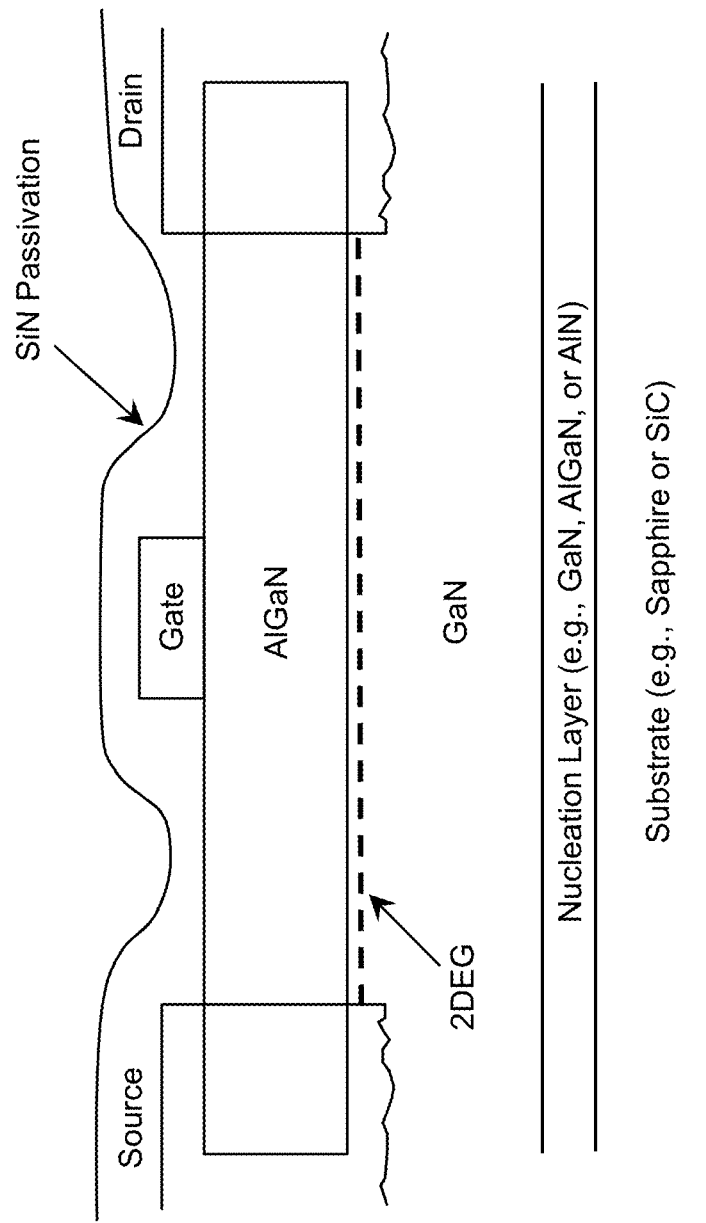
FIG. 1 shows an illustrative schematic structure of a gallium nitride-based heterostructure field effect transistor according to the prior art.
Figure 2:
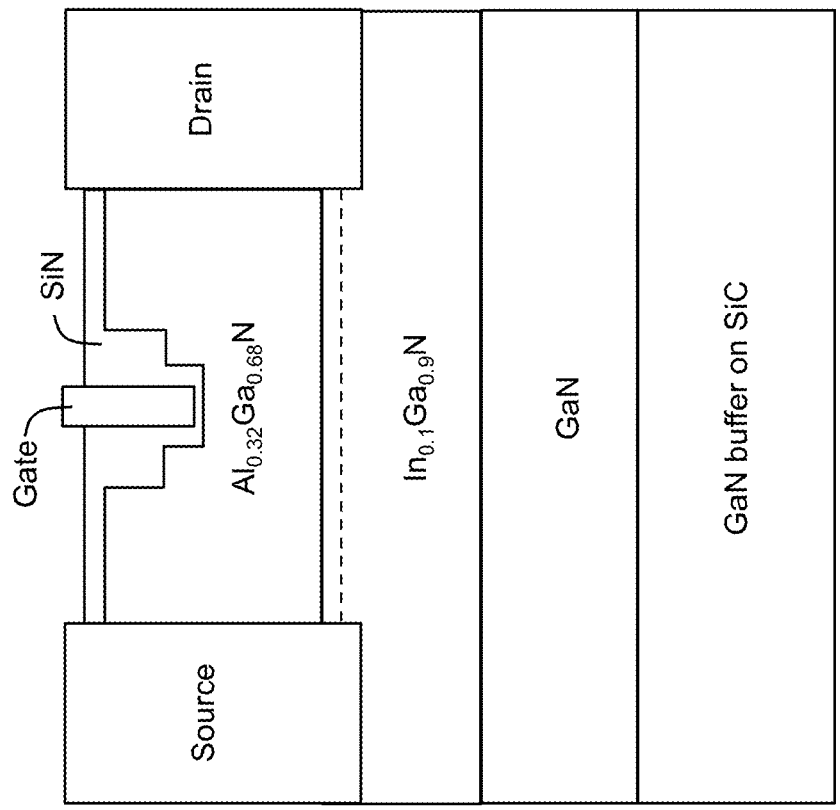
FIG. 2 shows an illustrative schematic structure of a recessed gate gallium nitride-based heterostructure field effect transistor according to the prior art.
Figure 3:
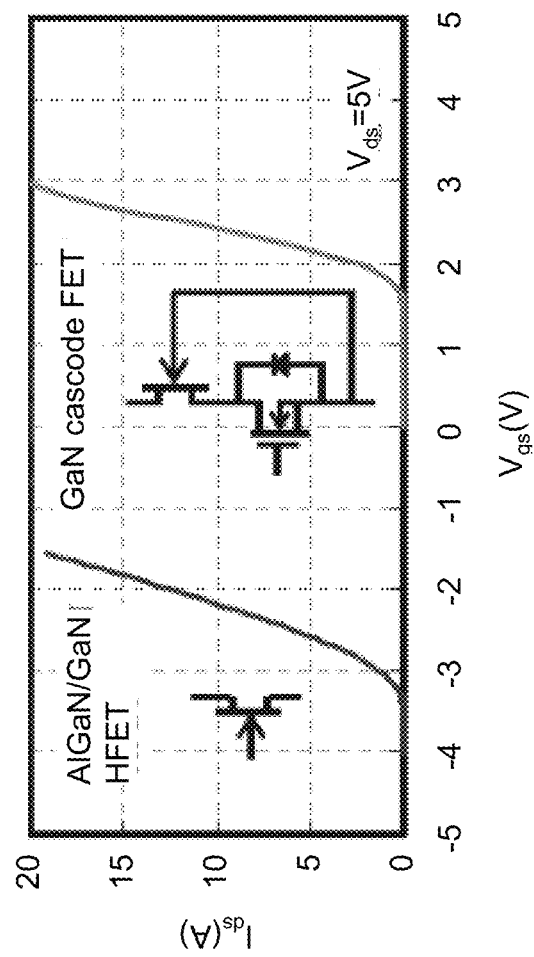
FIG. 3 shows an illustrative comparison of an AlGaN/GaN-based HFET with a cascode circuit according to the prior art.
Figure 4:
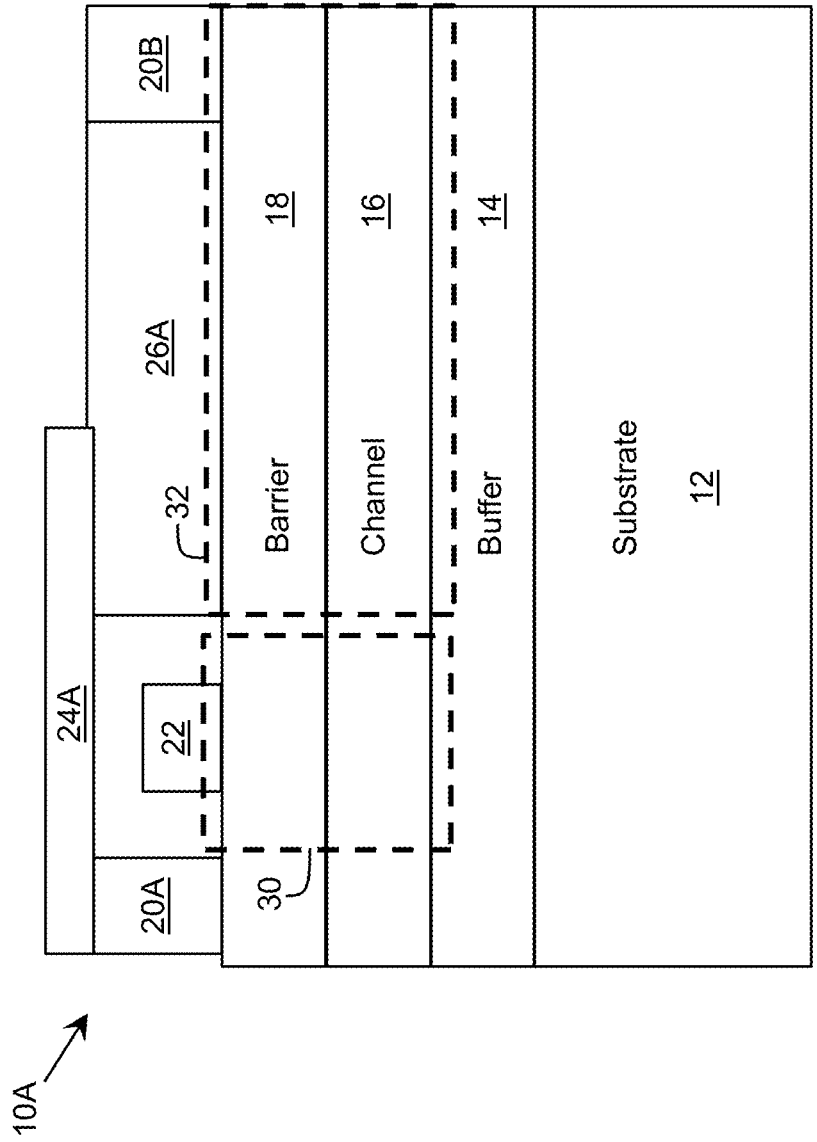
FIG. 4 shows a cross-section view of an illustrative semiconductor device according to a first embodiment.

Returning to the drawings, FIG. 4 shows a cross-section view of an illustrative semiconductor device 10A according to a first embodiment. The device 10A is shown including a substrate 12, a buffer 14, a channel 16, a barrier 18, a source electrode 20A, a drain electrode 20B, and a gate 22, each of which can be manufactured and fabricated using any solution. For example, the buffer 14 can comprise a single layer or a multi-layer structure, such as an initiation layer and/or a buffer layer. Additionally, the channel 16 can be formed by an active layer and/or the device 10A can include multiple channels 16, each of which is formed by a distinct layer. The barrier 18 also can comprise a single layer or a multi-layer structure. However, it is understood that the heterostructure shown for device 10A is only illustrative of various possible configurations for the device. For example, an embodiment of the device 10A can be formed without the barrier 18. Regardless, the heterostructure of the device 10A can include various layers made from any of a plurality of materials systems. Furthermore, one or more of the layers in a heterostructure described herein can include one or more attributes to alleviate strain. For example, a layer can be formed of a superlattice structure.

In an embodiment, the substrate 12 is formed of SiC, the channel 16 is formed of a gallium nitride (GaN) layer, and the barrier 18 is formed of an aluminum gallium nitride (AlGaN) layer. However, it is understood that this is only illustrative of various possible group III nitride based devices. To this extent, one or more layers forming the buffer 14, channel 16, and/or barrier 18 can be formed of any combination of various types of group III nitride materials comprising one or more group III elements (e.g., boron (B), aluminum (Al), gallium (Ga), and indium (In)) and nitrogen (N), such that $B_WAl_XGa_YIn_ZN$, where $0 \leq W, X, Y, Z \leq 1$, and $W+X+Y+Z=1$. Illustrative group III nitride materials include AlN, GaN, InN, BN, AlGaN, AlInN, AlBN, InGaN, GaBN, AlGaInN, AlGaBN, AlInBN, and AlGaInBN with any molar fraction of group III elements. Furthermore, it is understood that the device 10A can be formed from other semiconductor materials, including: other types of group III-V materials, such as GaAs, GaAlAs, InGaAs, indium phosphorus (InP), and/or the like; group II-VI materials, such as zinc oxide (ZnO), and/or the like; silicon (Si); germanium (Ge); silicon carbide (SiC); and/or the like. Similarly, the substrate 12 can be formed of any of various types of compound semiconductor or dielectric materials, including, for example: sapphire; diamond; mica; ceramic; germanium (Ge); various types of group III nitride substrates including GaN, AlN, BN, AlGaN, AlGaInN, GaBN, AlBN, AlInBN, AlGaBN, and/or the like; $LiGaO_2$, $LiNbO_2$, ZnO; Si; SiC; GaAs; and/or the like. Furthermore, the substrate 12 can comprise a conducting and/or semiconducting substrate.

Additionally, the device 10A includes a charge-controlling electrode 24A. The charge-controlling electrode 24A includes a first portion connected to the source electrode 20A, a second portion extending over/above the gate 22, and a third portion located on gap-filling material 26A. In an embodiment, each of the gate 22, the source electrode 20A, the drain electrode 20B, and the charge-controlling electrode 24A is formed of metal. However, it is understood that each of the gate 22, the source electrode 20A, the drain electrode 20B, and the charge-controlling electrode 24A can be formed of any type of conducting material, including for example, a semiconductor, a crystalline material, a polycrystalline material, and/or the like. The gap-filling material 26A can comprise any type of material, including a dielectric, a semi-insulating material, a semiconducting material, a conducting material, and/or the like. Furthermore, the gap-filling material 26A can comprise a single layer of material and/or a multi-layer material including any combination of material layers. In an embodiment, the gap-filling material 26A comprises a layer of low conducting (e.g., semi-insulating) material. The low conducting material can have a surface resistance that is significantly higher than that of metal electrodes, but is also much lower than that of a dielectric material. The practical values of the surface resistance of the low-conducting layer range from $10^3$ to $10^7$ Ohm/square. Illustrative low conducting materials include, for example: InGaN; a semiconductor; a low conducting dielectric single crystal material; a textured, polycrystalline or amorphous material; a semi-metal material; oxides of Ni and other metals and/or the like. Furthermore, in an embodiment, the charge-controlling electrode 24A is electrically isolated from the gate 22 via a spacing that is filled with an insulating material, such as air, and/or the like.

The device 10A includes a channel 16 having a plurality of adjacent sections 30, 32 in a direction between the source electrode 20A and the drain electrode 20B. Each section 30, 32 can include a corresponding threshold voltage that is distinct from the section(s) 30, 32 immediately adjacent thereto. In an embodiment, at least one of the sections, such as section 32, is a normally-on channel (e.g., threshold voltage less than or equal to zero) and at least one of the sections, such as section 30, is a normally-off channel (e.g., threshold voltage greater than zero). In this case, a side of the channel 16 closest to the source electrode 20A can comprise a normally-off section 30, while a side of the channel 16 between the gate 22 and the drain electrode 20B can comprise a normally-on section 32.

The gate 22 can be located near the source electrode 20A between the normally-off section 30 of the channel 16 and the charge-controlling electrode 24A. A voltage applied to the gate 22 can control the on/off state of the normally-off section 30. The charge-controlling electrode 24A can extend over at least a portion of or all of the normally-on section 32 of the channel 16. A potential difference between the charge-controlling electrode 24A and the channel 16 can control the on/off state of the normally-on section(s) 32 of the channel located between the normally-off section 30 and the drain electrode 20B. To this extent, unlike a field-modulating plate, which is widely used in high-voltage devices and is designed to have a minimal capacitance with respect to a channel, the charge-controlling electrode 24A can have a strong capacitive coupling with the channel 16, and therefore be capable of efficiently controlling the concentrations of mobile carriers in the channel 16. As used herein, the charge-controlling electrode 24A has a "strong capacitive coupling" with the channel 16 when the capacitance between the charge-controlling electrode 24A and the channel 16 is greater than or equal to a channel charge under the charge-controlling electrode 24A divided by the threshold voltage.

The different threshold voltages for the sections 30, 32 can be formed using any solution. For example, a threshold voltage for the normally-off section 30 can be adjusted using a recessed gate technique. Furthermore, the threshold voltage of a section 30, 32 can be adjusted by changing one or more of: a conductivity, polarization charges, a doping level, a semiconductor material composition, a surface potential, and/or the like, of the corresponding section of the channel 16. Still further, a device described herein can include one or more back gates, each of which is located on an opposing side of the channel 16 from the gate 22. In this case, during operation of the device in a circuit, a potential applied to a back gate can be used to adjust the corresponding threshold voltage using any solution.

When implemented in a circuit, the device 10A can operate as a field-effect transistor (FET) having both a normally-off channel 16 and a high operating voltage. In particular, when a voltage applied to the gate 22 is zero or below the threshold voltage for the normally-off section 30, the normally-off section 30 is in the non-conducting state. A potential of the normally-on section 32 is high, and a voltage between the charge-controlling electrode 24A and the normally-on section 32 can deplete this section 32. As a result, the entire device 10A is in the off state and the device 10A can absorb a high voltage applied to the drain electrode 20B. Furthermore, when a voltage applied to the gate 22 is above the threshold voltage for the normally-off section 30, the normally-off section 30 is in the conducting state. A potential of the normally-on section 32 is low, and a voltage between the charge-controlling electrode 24A and the normally-on section 32 is above the threshold voltage corresponding to the normally-on section 32. As a result, all of the sections 30, 32 of the channel 16 are in a conducting state and the device 10A has a low resistance. Consequently, the device 10A can operate as a low on-resistance, high-voltage power switch.

When the channel 16 is an n-type channel, the normally-off section 30 has a positive threshold voltage and the normally-on section 32 has a negative threshold voltage. As discussed herein, an external voltage applied to the gate 22 controls the on/off state of the normally-off section 30. Typically, the normally-off section 30 is depleted at zero gate bias. The potential difference between the charge-controlling electrode 24A and the channel 16 controls the on/off state of the normally-on section 32. In a typical application with the n-type channel, when the voltage potential at the gate 22 is zero or below threshold voltage for the normally-off section 30, the normally-off section 30 is in the non-conducting state and a significant portion of the drain voltage drops across the normally-off section 30. As a result, the potential of the normally-on section 32 is significantly higher than that of the source electrode 20A. Therefore, in a typical application when the voltage at the drain electrode 20B is higher than an absolute value of the threshold voltage for the normally-on section 32, a voltage between the charge-controlling electrode 24A and the normally-on section 32 turns the normally-on section 32 into the off state. Consequently, the entire channel 16 is in the off state when the gate voltage 22 is zero or below the threshold voltage of the normally-off section 30.

Since a high drain voltage is distributed over the entire channel 16, a peak electric field along the channel 16 can be kept sufficiently low to achieve high-voltage operation. In an embodiment, the gap-filling material 26A comprises a layer of low-conducting (semi-insulating) material, which can further increase a breakdown voltage of the device 10A. In this case, a finite conductance of the gap-filling material 26A can lead to a quasi-linear potential distribution along the gap-filling material 26A, and therefore along a surface of the semiconductor above the normally-on section 32 of the channel 16. A linear potential distribution leads to a quasi-uniform electric field in and above the channel 16, and therefore reduces/eliminates electric field peaks.

When a voltage applied to the gate 22 is above the threshold voltage for the normally-off section 30, the normally-off section 30 is in the conducting state and a voltage across the normally-off section 30 is low. As a result, a voltage between the charge-controlling electrode 24A and the normally-on section 32 is above the threshold voltage corresponding to the normally-on section 32. Therefore, all of the sections 30, 32 of the channel 16 are in a conducting state and the device 10A has a low resistance. Consequently, the device 10A can operate as a low on-resistance, high-voltage power switch.

Figure 5:
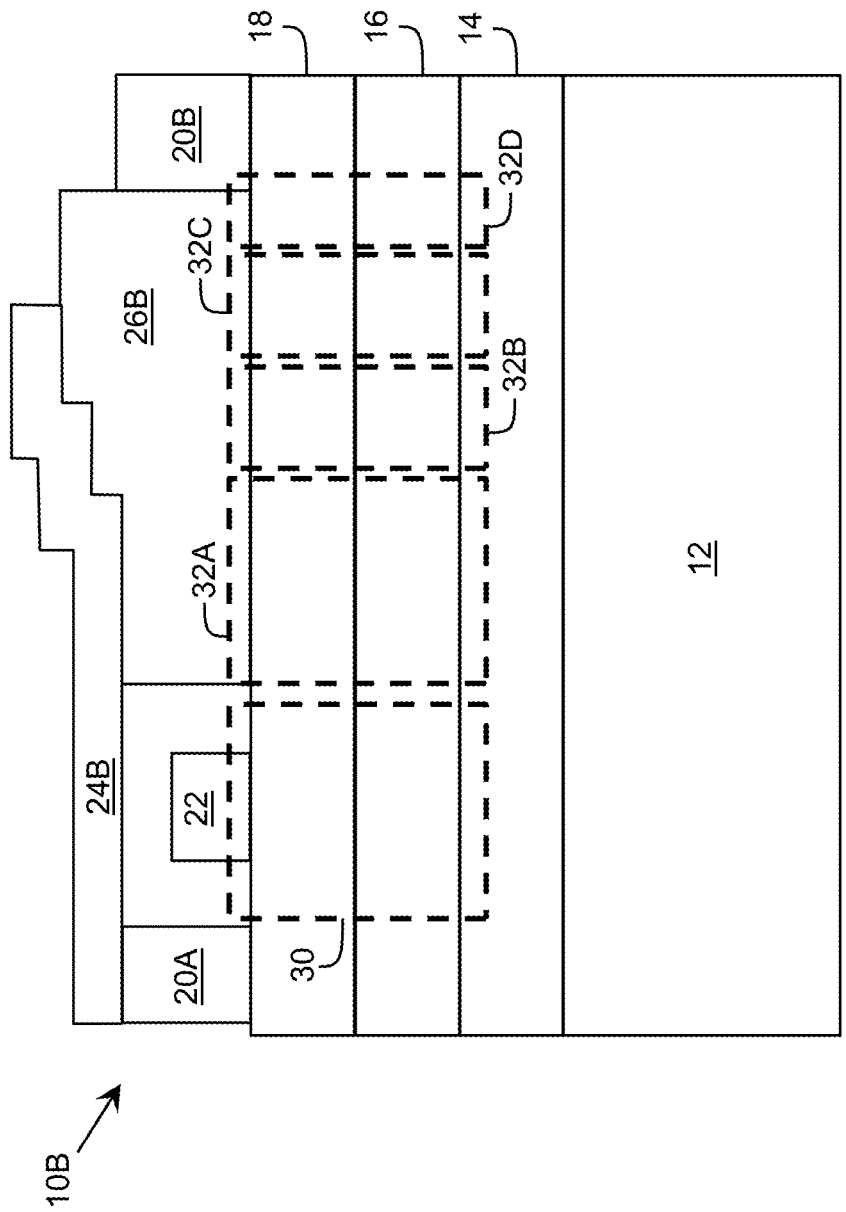
FIG. 5 shows a cross-section view of an illustrative semiconductor device according to a second embodiment.

It is understood that various embodiments of a device, such as a field effect transistor, can include one or more additional features. For example, FIG. 5 shows a cross-section view of an illustrative semiconductor device 10B according to a second embodiment. In this case, the channel 16 of the device 10B includes a plurality of normally-on sections 32A-32D between the gate 22 and the drain electrode 20B. Each of the normally-on sections 32A-32D can have a threshold voltage that differs from the threshold voltages for the other normally-on sections 32A-32D. A different threshold voltage can be achieved, for example, by: one or more layers in the heterostructure, such as the barrier 18, having a non-uniform thickness, composition, and/or doping along the channel 16; a non-uniform thickness and/or composition of the gap filling material 26B, and/or the like. In an embodiment, an absolute value of the threshold voltage for each of the plurality of normally-on sections 32A-32D increases from the gate 22 to the drain electrode 20B. However, it is understood that any type of variation of the threshold voltages can be implemented, e.g., depending on the circuit requirements for a target circuit in which the device 10B can be incorporated.

In an embodiment, the charge-controlling electrode 24B and the gap-filling material 26B are configured, e.g., using a step arrangement as shown, to provide a different metal-channel separation for each of the normally-on sections 32A-32D. Use of the step arrangement can provide the variable threshold voltage, and enable adjustment (e.g., optimization) of a potential profile in an active regions of the device 10B, e.g., to achieve a higher breakdown voltage. Furthermore, it is understood that a composition, thickness, doping, and/or the like, of the gap-filling material 26B located between the charge-controlling electrode 24B and each normally-on section 32A-32D can differ between the normally-on sections 32A-32D. While the device 10B is shown including a plurality of normally-on sections 32A-32D, it is understood that a device can include any number of one or more normally-off sections and normally-on sections, each of which is formed using any solution.

Figure 6:
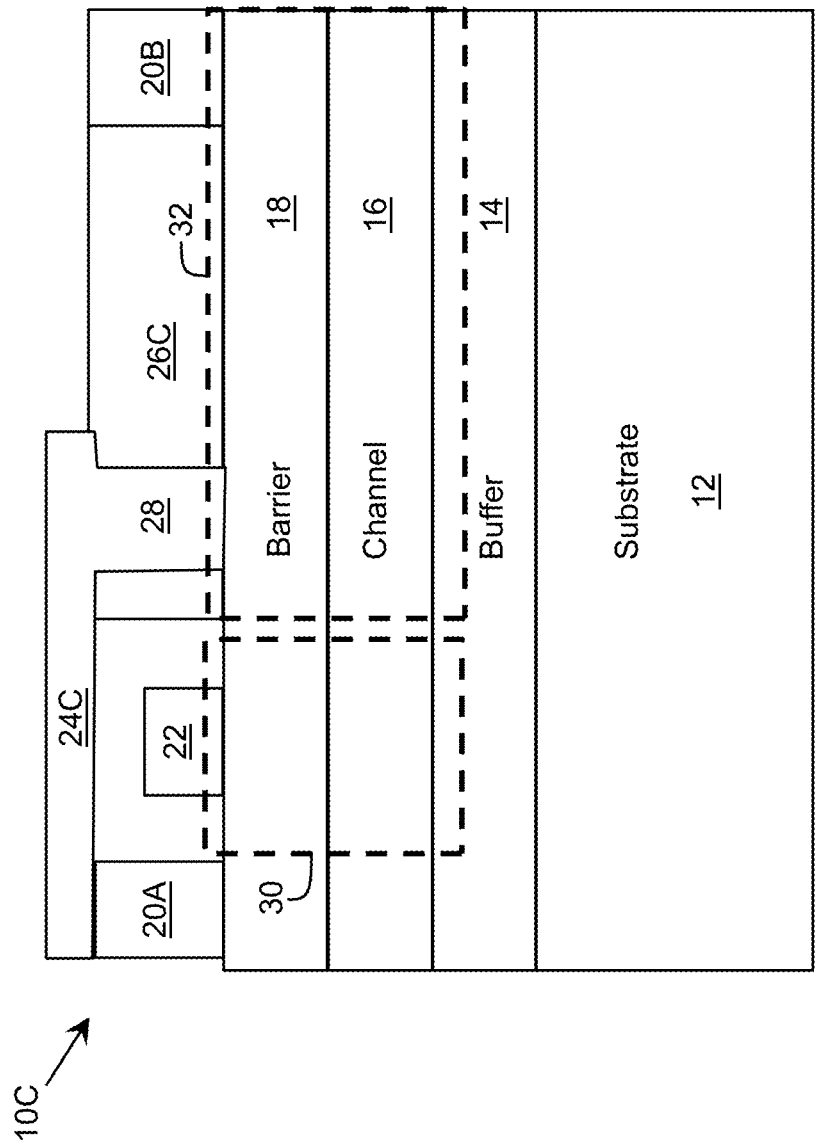
FIG. 6 shows a cross-section view of an illustrative semiconductor device according to a third embodiment.

FIG. 6 shows a cross-section view of an illustrative semiconductor device 100 according to a third embodiment. In the device 100, the charge-controlling electrode 24C includes a portion 28, which extends through the gap-filling material 26C and forms an internal contact with the normally-on section 32 of the channel 16. In an embodiment, the internal contact is a nonlinear contact, such as for example, a Schottky contact, a metal-insulator-semiconductor contact, and/or the like, with the normally-on section 32 of the channel 16. The internal contact formed by the portion 28 can provide a lower absolute value of the threshold voltage (e.g., typically down to between approximately three volts and approximately six volts) and thereby reduce the voltage required to turn the device 100 off. It is understood that when the channel 16 includes multiple normally-on sections, such as the sections 32A-32D shown in FIG. 5, the charge-controlling electrode 24C can form an additional contact with any number of zero or more of the sections.

Figure 7:
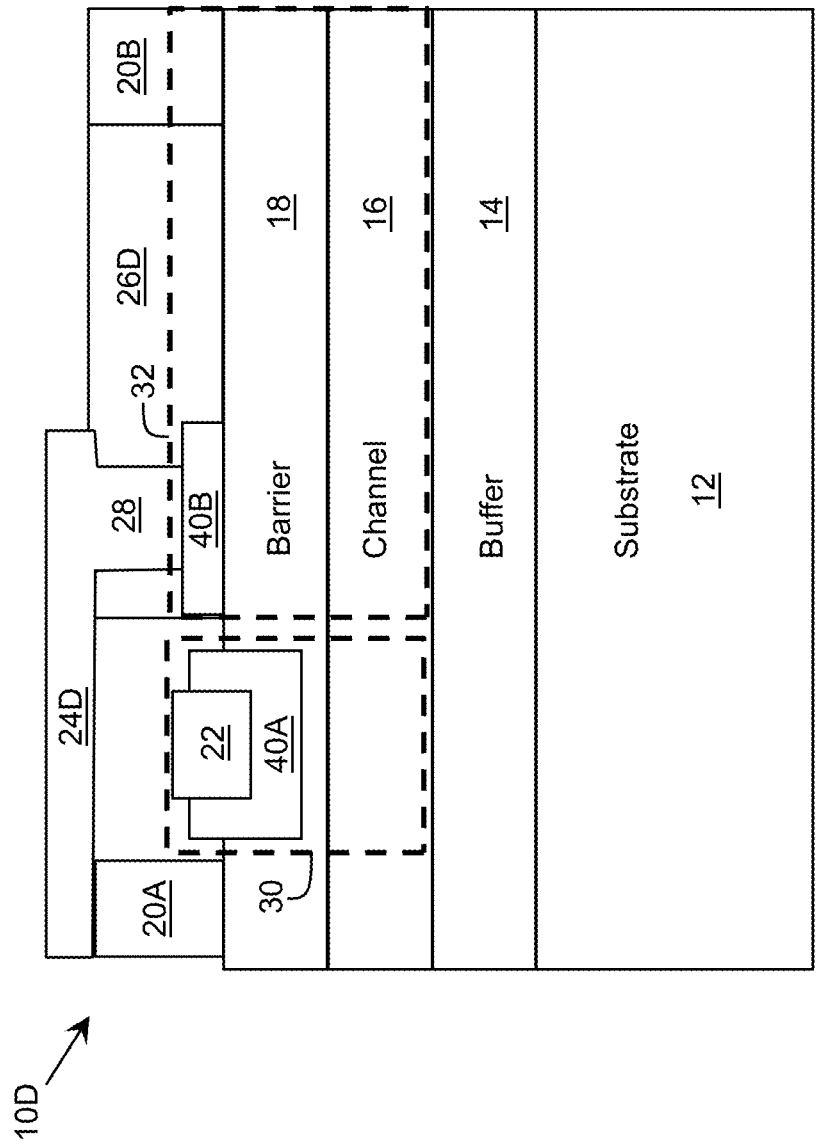
FIG. 7 shows a cross-section view of an illustrative semiconductor device according to a fourth embodiment.

FIG. 7 shows a cross-section view of an illustrative semiconductor device 10D according to a fourth embodiment. In the device 10D, the normally-off section 30 of the channel is shown being formed using a recessed gate 22. Furthermore, similar to the device 100 (FIG. 6), the charge-controlling electrode 24D includes a portion 28, which extends through the gap-filling material 26D toward the normally-on section 32 of the channel 16. However, the device 10D includes insulating layers 40A, 40B, which are located between the channel 16 and the gate 22 and the portion 28, respectively. As a result, both the gate 22 and the portion 28 form a metal-insulator-semiconductor structure with the channel 16 using the insulating layers 40A, 40B, respectively. The insulating layers 40A, 40B can significantly reduce the gate leakage currents for the device 10D, and thereby further reduce loss due to the device 10D, increase an operating voltage for the device 10D, improve reliability of the device 10D, and/or the like. It is understood that each insulating layer 40A, 40B can be formed of any type of dielectric material including, for example, silicon dioxide, silicon nitride, aluminum oxide, aluminum nitride, hafnium oxide, and/or the like.

Figure 8:
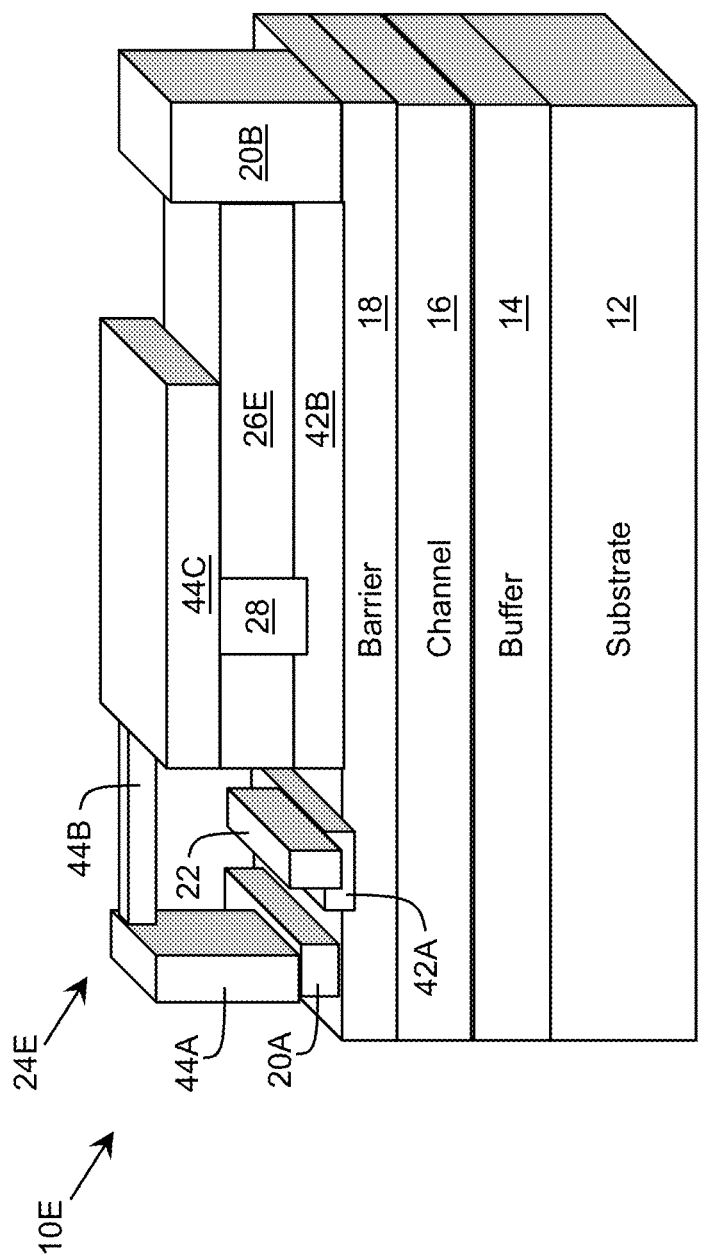
FIG. 8 shows a perspective view of an illustrative semiconductor device according to a fifth embodiment.

FIG. 8 shows a perspective view of an illustrative semiconductor device 10E according to a fifth embodiment. In this embodiment, the device 10E includes a pair of insulating layers 42A, 42B, each of which can be configured similar to the insulating layers 40A, 40B of FIG. 7. Furthermore, the device 10E includes a charge-controlling electrode 24E, which is formed of a plurality of subsections 44A-44C. In particular, the subsection 44A is connected to the source electrode 20A, the subsection 44B extends over the gate 22, and the subsection 44C is located on the gap-filling material 26E. As illustrated, the insulating layer 42B extends below the entire width and length of the gap-filling material 26E, which can allow for a reduced parasitic capacitance and leakage between the subsection 44C and the channel 16. Furthermore, the subsection 44B of the charge-controlling electrode 24E can have a reduced width as measured in a direction perpendicular to the direction from the source electrode 20A to the drain electrode 20B. The reduced width of the subsection 44B corresponds to an area where the charge-controlling electrode 24E crosses the gate 22. In this case, the reduced width of the subsection 44B can decrease an amount of capacitance between the charge-controlling electrode 24E and the gate 22.

Figure 9:
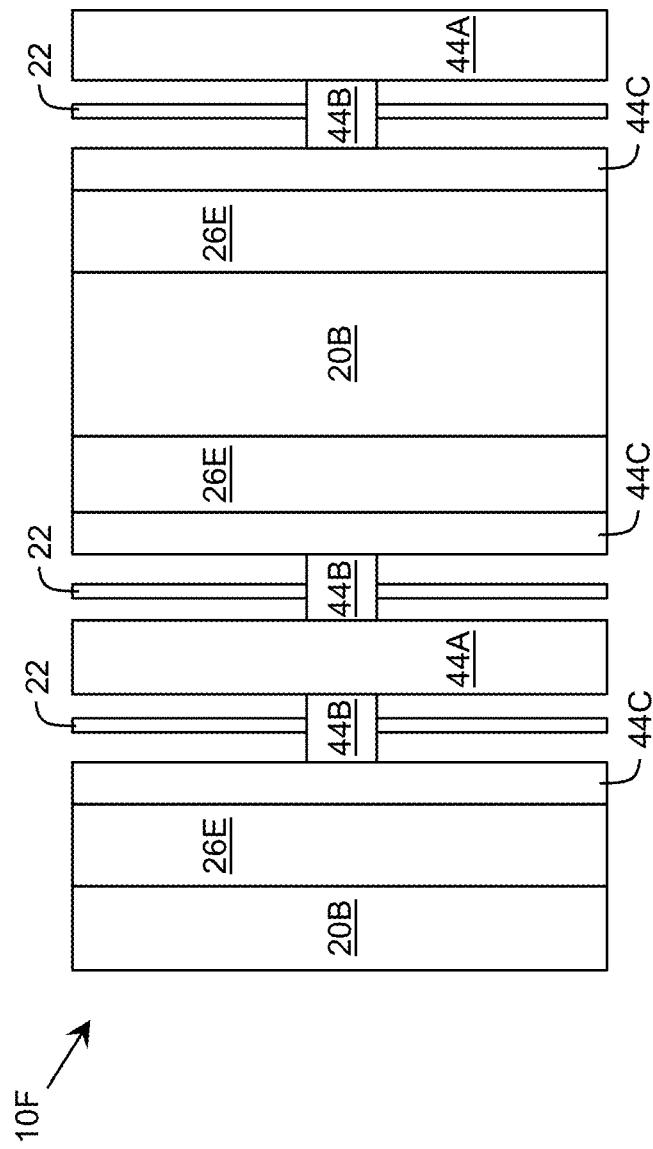
FIG. 9 shows a top view of an illustrative semiconductor device according to a sixth embodiment.

FIG. 9 shows a top view of an illustrative semiconductor device 10F according to a sixth embodiment. The semiconductor device 10F includes a pair of charge controlling electrodes configured similar to the charge-controlling electrode 24E of the device 10E of FIG. 8. To this extent, each charge-controlling electrode includes multiple subsections 44A-44C where each subsection 44A is located over a source electrode 20A (FIG. 8) of the device 10F, each subsection 44B has a reduced width and extends over a gate 22 of the device 10F, and each subsection 44C is located on a portion of the gap-filling material 26E located between a gate 22 and a drain electrode 20B. The device 10F comprises an interdigitated, multi-finger geometry, which can achieve a larger active area, a lower on-resistance, and a higher peak current than the device 10E.

Figure 10:
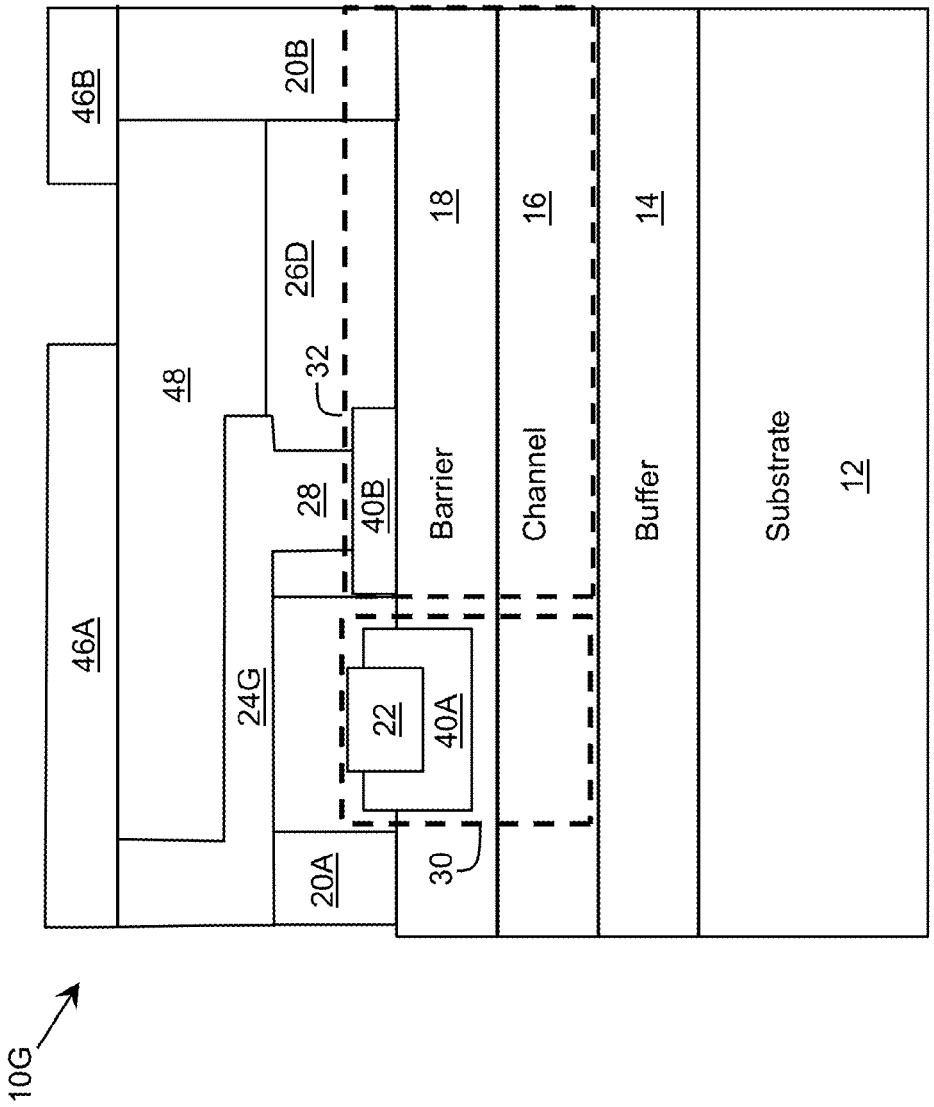
FIG. 10 shows a cross-section view of an illustrative semiconductor device according to a seventh embodiment.

FIG. 10 shows a cross-section view of an illustrative semiconductor device 10G according to a seventh embodiment. The semiconductor device 10G is configured similar to the device 10D of FIG. 7. However, the charge-controlling electrode 24G is also connected to a field-modulating electrode 46A. Similarly, the drain electrode 20B also is connected to a field-modulating electrode 46B. Inclusion of the field-modulating electrodes 46A, 46B can provide further control over the electric field uniformity for the device 10G. In an embodiment, each field-modulating electrode 46A, 46B is formed of metal or a low conducting material as described herein. Furthermore, each field-modulating electrode 46A, 46B can be located on an insulating layer 48 formed of, for example, a dielectric material.

Aspects of the invention are shown and described primarily with reference to a heterostructure field effect transistor. However, it is understood that a charge-controlling electrode described herein can be implemented in various types of field-effect transistors, including, for example, a field-effect transistor, a heterostructure field-effect transistor, an insulated gate field-effect transistor, an insulated gate heterostructure field-effect transistor, a multiple channel heterostructure field-effect transistor, a multiple channel heterostructure insulated gate field-effect transistor, an inverted field-effect transistor, an inverted heterostructure field-effect transistor, an inverted insulated gate field-effect transistor, an inverted insulated gate heterostructure field-effect transistor, an inverted multiple channel heterostructure field-effect transistor, an inverted insulated gate multiple channel heterostructure field-effect transistor, and/or the like. Additionally, the charge-controlling electrode described herein can be implemented in other types of semiconductor devices, including for example, a diode of any type, a semiconductor resistor, a semiconductor sensor, a light emitting diode, a laser, an integrated element, a transistor integrated with light emitting diode, a laser with and/or integrated with other circuit components, and/or the like.

While shown and described herein as a method of designing and/or fabricating a semiconductor device, it is understood that aspects of the invention further provide various alternative embodiments. For example, in one embodiment, the invention provides a method of designing and/or fabricating a circuit that includes one or more of the semiconductor devices designed and fabricated as described herein.

Figure 11:
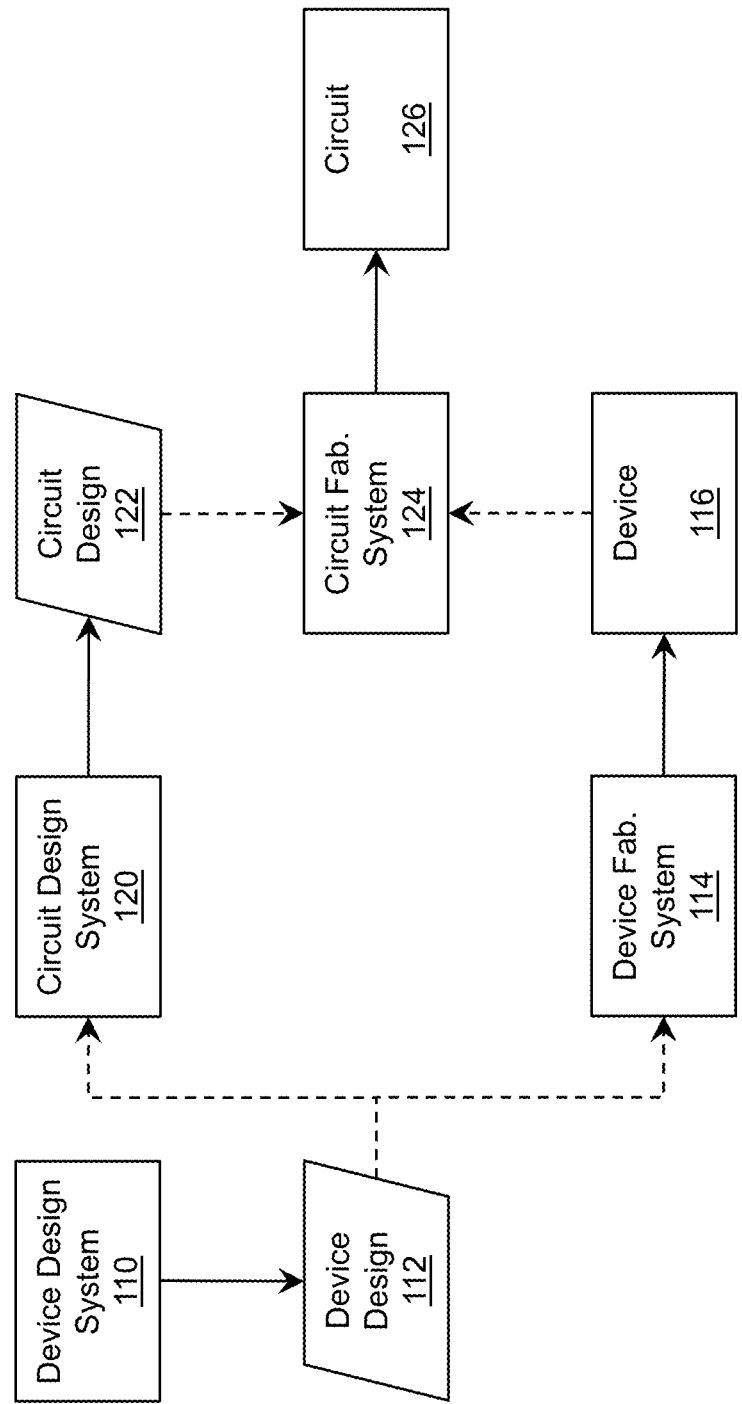
FIG. 11 shows an illustrative flow diagram for fabricating a circuit according to an embodiment.

To this extent, FIG. 11 shows an illustrative flow diagram for fabricating a circuit 126 according to an embodiment. Initially, a user can utilize a device design system 110 to generate a device design 112 for a semiconductor device as described herein. The device design 112 can comprise program code, which can be used by a device fabrication system 114 to generate a set of physical devices 116 according to the features defined by the device design 112. Similarly, the device design 112 can be provided to a circuit design system 120 (e.g., as an available component for use in circuits), which a user can utilize to generate a circuit design 122 (e.g., by connecting one or more inputs and outputs to various devices included in a circuit). The circuit design 122 can comprise program code that includes a device designed as described herein. In any event, the circuit design 122 and/or one or more physical devices 116 can be provided to a circuit fabrication system 124, which can generate a physical circuit 126 according to the circuit design 122. The physical circuit 126 can include one or more devices 116 designed as described herein.

In another embodiment, the invention provides a device design system 110 for designing and/or a device fabrication system 114 for fabricating a semiconductor device 116 as described herein. In this case, the system 110, 114 can comprise a general purpose computing device, which is programmed to implement a method of designing and/or fabricating the semiconductor device 116 as described herein. Similarly, an embodiment of the invention provides a circuit design system 120 for designing and/or a circuit fabrication system 124 for fabricating a circuit 126 that includes at least one device 116 designed and/or fabricated as described herein. In this case, the system 120, 124 can comprise a general purpose computing device, which is programmed to implement a method of designing and/or fabricating the circuit 126 including at least one semiconductor device 116 as described herein.

In still another embodiment, the invention provides a computer program fixed in at least one computer-readable medium, which when executed, enables a computer system to implement a method of designing and/or fabricating a semiconductor device as described herein. For example, the computer program can enable the device design system 110 to generate the device design 112 as described herein. To this extent, the computer-readable medium includes program code, which implements some or all of a process described herein when executed by the computer system. It is understood that the term "computer-readable medium" comprises one or more of any type of tangible medium of expression, now known or later developed, from which a stored copy of the program code can be perceived, reproduced, or otherwise communicated by a computing device.

In another embodiment, the invention provides a method of providing a copy of program code, which implements some or all of a process described herein when executed by a computer system. In this case, a computer system can process a copy of the program code to generate and transmit, for reception at a second, distinct location, a set of data signals that has one or more of its characteristics set and/or changed in such a manner as to encode a copy of the program code in the set of data signals. Similarly, an embodiment of the invention provides a method of acquiring a copy of program code that implements some or all of a process described herein, which includes a computer system receiving the set of data signals described herein, and translating the set of data signals into a copy of the computer program fixed in at least one computer-readable medium. In either case, the set of data signals can be transmitted/received using any type of communications link.

In still another embodiment, the invention provides a method of generating a device design system 110 for designing and/or a device fabrication system 114 for fabricating a semiconductor device as described herein. In this case, a computer system can be obtained (e.g., created, maintained, made available, etc.) and one or more components for performing a process described herein can be obtained (e.g., created, purchased, used, modified, etc.) and deployed to the computer system. To this extent, the deployment can comprise one or more of: (1) installing program code on a computing device; (2) adding one or more computing and/or I/O devices to the computer system; (3) incorporating and/or modifying the computer system to enable it to perform a process described herein; and/or the like.

The foregoing description of various aspects of the invention has been presented for purposes of illustration and description. It is not intended to be exhaustive or to limit the invention to the precise form disclosed, and obviously, many modifications and variations are possible. Such modifications and variations that may be apparent to an individual in the art are included within the scope of the invention as defined by the accompanying claims.

What is claimed is:

1. A field effect transistor comprising:
    a source electrode and a drain electrode;
    a channel extending from the source electrode to the drain electrode, wherein the channel includes a plurality of adjacent sections, the plurality of adjacent sections including:
        a first section located adjacent to the source electrode, wherein the first section is a normally-off channel;
        a second section located between the first section and the drain electrode, wherein the second section is a normally-on channel; and
        a third section located between the second section and the drain electrode, wherein the third section is a normally-on channel having a different voltage threshold than a voltage threshold of the second section, and wherein an absolute value of the voltage threshold for the third section is greater than an absolute value of the voltage threshold for the second section;
    a gate to the first section of the channel;
    a charge-controlling electrode connected to the source electrode and physically isolated from the gate, wherein the charge-controlling electrode extends from the source electrode over the gate and over the second section and at least a portion of the third section;
    a gap-filling material located vertically between the charge-controlling electrode and the second and third sections of the channel and located laterally only within a region between the gate and the drain electrode such that the gap-filling material does not extend over the gate; and
    a gate isolation material located between the gate and the channel.

2. The transistor of claim 1, wherein a width of a portion of the charge-controlling electrode extending over the gate is smaller than a width of the gate.

3. The transistor of claim 1, wherein the charge-controlling electrode comprises a capacitive coupling with the second section of the channel sufficient to control a concentration of mobile carriers in the second section of the channel.

4. The transistor of claim 1, wherein a difference in at least one of: a separation or the gap-filling material between the charge-controlling electrode and the channel defines a boundary between the second section and the third section, and wherein a capacitive coupling between the charge-controlling electrode and the channel is greater for the second section than the third section.

5. The transistor of claim 1, further comprising an internal contact located between the gate and the drain electrode, wherein the internal contact is connected to the charge-controlling electrode.

6. The transistor of claim 5, further comprising an internal contact isolation material located between the internal contact and the channel.

7. The transistor of claim 1, wherein the source electrode, the gate, the drain electrode, and the charge-controlling electrode form an interdigitated, multi-finger pattern.

8. A device comprising:
a semiconductor including a channel extending from a source electrode to a drain electrode, wherein the channel includes a plurality of adjacent sections, the plurality of adjacent sections including:
a first section located adjacent to the source electrode, wherein the first section is a normally-off channel;
a second section located between the first section and the drain electrode, wherein the second section is a normally-on channel; and
a third section located between the second section and the drain electrode, wherein the third section is a normally-on channel having a different voltage threshold than a voltage threshold of the second section, and wherein an absolute value of the voltage threshold for the third section is greater than an absolute value of the voltage threshold for the second section;
a gate to the first section of the channel;
a gate isolation material located between the gate and the channel;
a charge-controlling electrode connected to the source electrode, wherein the charge-controlling electrode extends substantially parallel to the channel from the source electrode over the first section and at least a portion of the second section, and extends over at least a portion of the third section; and
a low conducting gap-filling material contacting the drain electrode and located vertically between the charge-controlling electrode and the second and third sections of the channel and located laterally only within a region between the gate and the drain electrode such that the low conducting gap-filling material does not extend over the gate.

9. The device of claim 8,
wherein a width of a portion of the charge-controlling electrode extending over the gate is smaller than a width of the gate.

10. The device of claim 8, wherein the charge-controlling electrode comprises a capacitive coupling with the second section of the channel sufficient to control a concentration of mobile carriers in the second section of the channel.

11. The device of claim 8, wherein the semiconductor is formed of one of: silicon, silicon carbide, or a group III-V material.

12. The device of claim 8, wherein the semiconductor is formed of a group III nitride material.

13. The device of claim 8, wherein the device is configured to operate as a field effect transistor.

14. A method comprising:
fabricating a device, the fabricating comprising:
forming a semiconductor including a channel, wherein the channel includes a plurality of adjacent sections, the plurality of adjacent sections including:
a first section located adjacent to a first end of the channel, wherein the first section is a normally-off channel;
a second section located between the first section and a second end of the channel opposite the first end, wherein the second section is a normally-on channel; and
a third section located between the second section and the second end of the channel, wherein the third section is a normally-on channel having a different voltage threshold than a voltage threshold of the second section, and wherein an absolute value of the voltage threshold for the third section is greater than an absolute value of the voltage threshold for the second section;
wherein the device further includes:
a source electrode to the first end of the channel;
a drain electrode to the second end of the channel;
a gate to the first section of the channel;
a gate isolation material located between the gate and the channel;
a charge-controlling electrode connected to the source electrode, wherein the charge-controlling electrode extends substantially parallel to the channel from the source electrode over the first section and at least a portion of the second section, and extends over at least a portion of the third section; and
a gap-filling material located vertically between the charge-controlling electrode and the second and third sections of the channel and located laterally only within a region between the gate and the drain electrode such that the gap-filling material does not extend over the gate.

15. The method of claim 14, wherein the forming the semiconductor including the channel includes adjusting at least one of: a conductivity, a polarization charge, a doping level, a semiconductor material composition, or a surface potential between the semiconductor corresponding the first section and the semiconductor corresponding the second section.

16. The method of claim 14, wherein the forming the semiconductor including the channel includes forming a back gate to at least one of the first section or the second section.

17. The transistor of claim 1, wherein a change in at least one attribute of the gap-filling material defines a boundary between each of the plurality of adjacent sections of the channel, and wherein the at least one attribute of the gap-filling material includes at least one of: a doping, a thickness, or a composition.

18. The transistor of claim 1, wherein all of a top surface of the gap-filling material is further from the channel than the gate.

19. The device of claim 8, wherein a change in at least one attribute of the gap-filling material defines a boundary between each of the plurality of adjacent sections of the channel, and wherein the at least one attribute of the gap-filling material includes at least one of: a doping, a thickness, or a composition.

20. The device of claim 8, wherein all of a top surface of the gap-filling material is further from the channel the gate.

* * * * *

UNITED STATES PATENT AND TRADEMARK OFFICE
CERTIFICATE OF CORRECTION

PATENT NO. : 9,263,533 B2  
APPLICATION NO. : 13/622379  
DATED : February 16, 2016  
INVENTOR(S) : Grigory Simin, Michael Shur and Remigijus Gaska It is certified that error appears in the above-identified patent and that said Letters Patent is hereby corrected as shown below:

In the specification

Column 7, lines 21, 22, 33, and 42, each occurrence of "device 100" should read --device 10C--.

Signed and Sealed this  
Tenth Day of May, 2016

Michelle K. Lee  
*Director of the United States Patent and Trademark Office*